(12) United States Patent
Hampp et al.

(10) Patent No.: US 7,892,939 B2
(45) Date of Patent: Feb. 22, 2011

(54) THRESHOLD VOLTAGE CONSISTENCY AND EFFECTIVE WIDTH IN SAME-SUBSTRATE DEVICE GROUPS

(75) Inventors: Roland Hampp, Poughkeepsie, NY (US); Manfred Eller, Beacon, NY (US); Jin-Ping Han, Fishkill, NY (US); Matthias Lipinski, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 79 days.

(21) Appl. No.: 12/043,384

(22) Filed: Mar. 6, 2008

(65) Prior Publication Data

US 2009/0227086 A1    Sep. 10, 2009

(51) Int. Cl.
*H01L 21/76* (2006.01)
*H01L 21/311* (2006.01)

(52) U.S. Cl. .................. 438/407; 438/413; 438/423; 438/701; 257/E21.551

(58) Field of Classification Search ............... 438/407, 438/413, 423, 473, 701; 257/E21.551, E21.556–558
See application file for complete search history.

(56) References Cited

U.S. PATENT DOCUMENTS

| | | | |
|---|---|---|---|
| 6,514,833 B1 * | 2/2003 | Ishida et al. ............... 438/424 |
| 7,176,104 B1 * | 2/2007 | Chen et al. ................. 438/424 |
| 7,186,622 B2 | 3/2007 | Yan et al. | |
| 7,298,009 B2 | 11/2007 | Yan et al. | |
| 2001/0001723 A1 * | 5/2001 | Gardner et al. ............. 438/305 |
| 2001/0023112 A1 * | 9/2001 | Leobandung ............... 438/423 |
| 2002/0055236 A1 * | 5/2002 | Chen .......................... 438/437 |
| 2002/0100952 A1 * | 8/2002 | Hong ......................... 257/510 |
| 2004/0079990 A1 * | 4/2004 | Schrems et al. ............ 257/330 |
| 2004/0102017 A1 * | 5/2004 | Chang et al. ............... 438/424 |
| 2004/0251513 A1 * | 12/2004 | Su et al. ..................... 257/510 |
| 2005/0142706 A1 * | 6/2005 | Ahn et al. ................... 438/165 |
| 2007/0141852 A1 * | 6/2007 | Stapelmann et al. ....... 438/758 |
| 2007/0148921 A1 | 6/2007 | Yan et al. | |
| 2007/0235801 A1 * | 10/2007 | Cheng et al. ............... 257/330 |
| 2008/0124847 A1 * | 5/2008 | Sudo .......................... 438/152 |
| 2009/0026552 A1 * | 1/2009 | Zhang et al. ............... 257/401 |

* cited by examiner

*Primary Examiner*—Hsien-ming Lee
*Assistant Examiner*—Kevin Parendo
(74) *Attorney, Agent, or Firm*—Slater & Matsil, L.L.P.

(57) ABSTRACT

The prevention of active area loss in the STI model is disclosed which results in an improved device performance in devices manufactured according to the process flow. The process generally shared among the multiple various embodiments inverts the current conventional STI structure towards a process flow where an insulator is patterned with tapered trenches. A segregation layer is formed beneath the surface of the insulator in the tapered trenches. The tapered trenches are then filled with a semiconductor material which is further processed to create a number of active devices. Therefore, the active devices are created in patterned dielectric instead of the STI being created in the semiconductor substrate of the active devices.

19 Claims, 2 Drawing Sheets

THRESHOLD VOLTAGE CONSISTENCY AND EFFECTIVE WIDTH IN SAME-SUBSTRATE DEVICE GROUPS

TECHNICAL FIELD

The present invention relates, in general, to semiconductor manufacturing and, more particularly, to a process for improving threshold voltage consistency and improving the effective width in device groups formed within the same substrate.

BACKGROUND

As semiconductor technology decreases in size, more devices are being placed on a single die or chip. With so many devices in such close proximity to one another, the importance of insulating the devices from each other becomes paramount in order for the finished product to operate properly and reliably. One method that has been used effectively is the shallow trench isolation (STI). STI fabrication essentially comprises etching shallow trenches in the substrate between the devices and then filling those trenches with an effective insulator. The size and location of the STI provides isolation of devices.

One problem with forming STI between active devices comes from the oxidation that typically occurs in the immediately surround substrate of the STI. This oxidation actually often encroaches on the corners of the device. Because the oxidation essentially makes that portion of the substrate inoperable with the active device, the effective width of the device is geometrically reduced. Transistor current scales with the device width. Therefore, the reduced width caused by the oxidation generally degrades the performance of the active device. As device technology gets smaller and smaller, the effect of this reduced width, especially on narrow-width devices, become more pronounced. However, because the importance of isolating the active devices on the die or chip is paramount, manufacturers generally accept the decreased performance to preserve that isolation.

In the conventional STI approach, the STI liner generally influences the leakage and isolation parameters of the device. During the liner process the active area corner will typically be oxidized and therefore reduced in size, as discussed above. However, during the high temperature anneal process that usually follows the oxide fill and after chemical-mechanical polishing (CMP) the active area typically suffers from further shrinkage. The most common problems of this integration scheme are uniformity issues typically found in the etching, deposition, and polishing processes. Problems such as this will likely be most pronounced in the newer 32 nm technology and beyond.

SUMMARY OF THE INVENTION

Representative embodiments of the present invention provide methods for isolating active devices, by etching a plurality of tapered trenches into a dielectric layer lying over a semiconductor substrate. A segregation barrier is formed beneath a surface of the dielectric layer of the tapered trenches, after which each of the tapered trenches is filled with a semiconductor material. The semiconductor material is further processed into a plurality of active devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
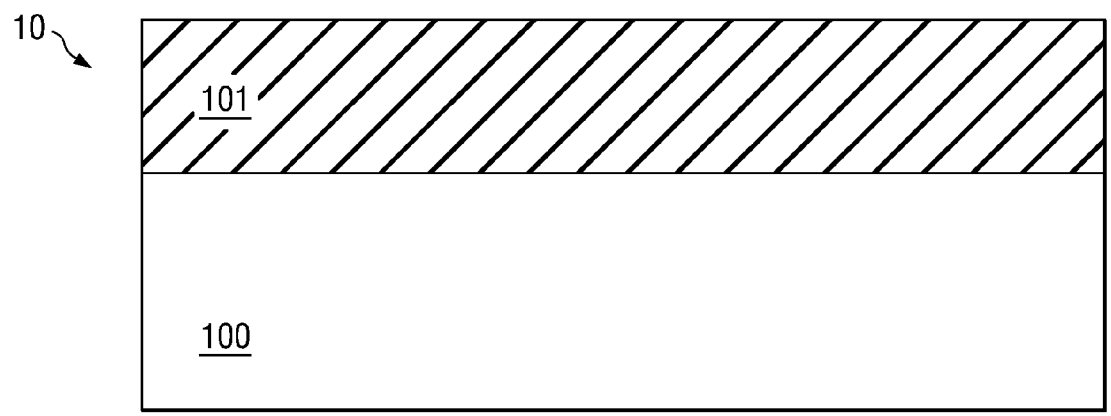
FIG. 1 is a diagram illustrating a semiconductor wafer shown in a first processing step configured according to one embodiment of the present invention.

Turning now to FIG. 1, semiconductor wafer 10 is shown in a first processing step configured according to one embodiment of the present invention. Semiconductor wafer 10 comprises substrate 100. Substrate 100 may be made from a semiconductor substrate material such as silicon, gallium arsenic, germanium, or the like. In a first processing step, dielectric layer 101 is deposited on top of substrate 100. Dielectric layer 101 may be made from various dielectric materials, such as silicon dioxide, silicon nitride, and the like, and may have any suitable dielectric constant, high or low.

It should be noted that in additional and/or alternative embodiments of the present invention, a silicon-on-insulator (SOI) wafer may be used instead of depositing a dielectric layer onto bulk silicon or other type of semiconductor substrate. Thus, FIG. 1 may also represent this additional and/or alternative device in which semiconductor wafer 10 comprises an SOI wafer in which substrate 100 is the "silicon" portion of the SOI wafer, and dielectric layer 101 is the "insulator" portion of the SOI wafer.

Figure 2:
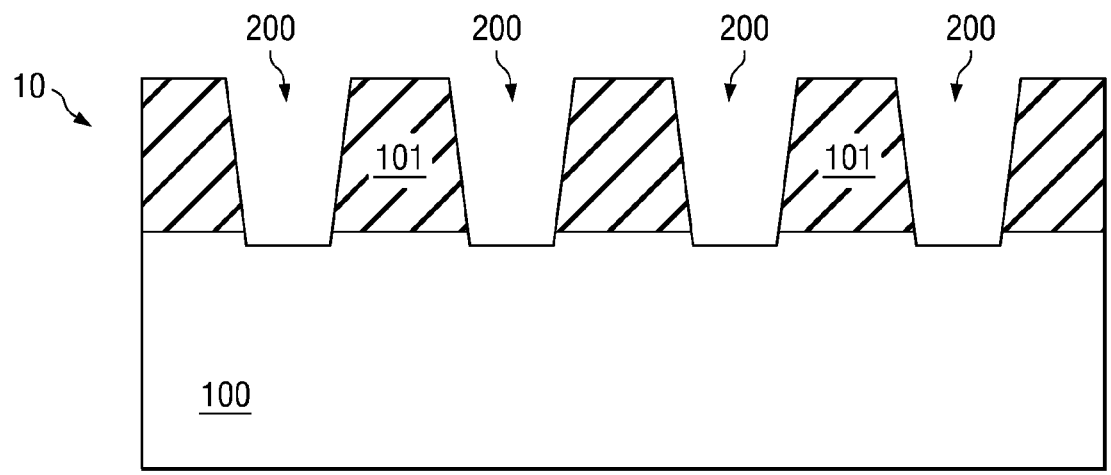
FIG. 2 is a diagram illustrating the semiconductor wafer in a next processing step configured according to one embodiment of the present invention.

FIG. 2 is a diagram illustrating semiconductor wafer 10 in a next processing step configured according to one embodiment of the present invention. Tapered trenches 200 are etched into dielectric layer 101. Various etching methods may be used to form tapered trenches 200, including reactive ion etching (RIE), or any other type of dry or wet etching technique that will produce a tapered void. In order to better control sidewall angle and etch profile, RIE is the preferred methodology. State-of-the-art dielectric RIE processes (i.e. based on polymerizing fluorocarbon chemistry) can be applied. After the etch is complete, semiconductor wafer 10 is cleaned to remove any residue or other loose contaminant.

The tapering of tapered trenches 200 is important to increase the current load available in the active area that will be formed, as described below. Moreover, because the tapering provides a wider separation between adjacent devices in dielectric layer 101, a greater isolation effect results. Thus, the tapering serves to maximize or optimize both current capacity and isolation effect in semiconductor components configured according to the various embodiments of the present invention.

Figure 3:
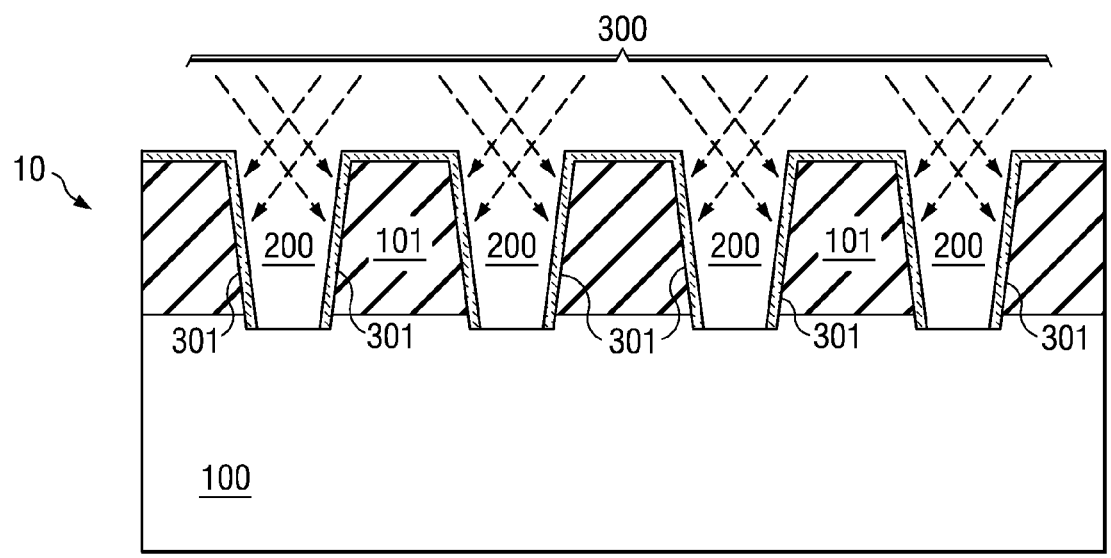
FIG. 3 is a diagram illustrating the semiconductor wafer in a next processing step configured according to one embodiment of the present invention.

FIG. 3 is a diagram illustrating semiconductor wafer 10 in a next processing step configured according to one embodiment of the present invention. After etching tapered trenches 200 (FIG. 2) into dielectric layer 101, barrier material 300 is implanted at angles to the surface of semiconductor wafer 10 and directed within tapered trenches 200 (FIG. 2). The implantation of barrier material 300 forms segregation layers 301 beneath the surface of dielectric layer 101. Barrier material 300 is selected so that segregation layers 301 prevent boron segregation from the later-formed active regions into dielectric layer 101. Semiconductor active regions are typically doped with boron because of the acceptor levels it provides. However, boron has a higher affinity to dielectrics, such as silicon dioxide, and the like. Therefore, without segregation layers 301, the boron in the active layer would tend to migrate or segregate into dielectric layer 101. Barrier material 300 may be any suitable substance that prevents such boron segregation, such as carbon and nitrogen, and the like.

Forming segregation layers 301 beneath the surface of dielectric layer 101 also beneficially maintains a consistent device width and geometry throughout the combined device. Depositing a barrier layer on top of dielectric layer 101 is not desirable in the various embodiments of the present invention as the additional space taken by the deposited layer would effectively reduce the overall device width, thus, reducing the overall current capacity in the device.

Segregation layers 301 also increase the consistency of threshold voltages for each device in the device group created in the same substrate. The leakage or segregation of boron into the dielectric layer 101 tends to cause a shift in the threshold voltage among the multiple devices produced in the same substrate for the device group. Therefore, resulting device groups will tend to have devices with different threshold voltages right next to each other. This difference in threshold voltage may lead to damage or unexpected operating results, both of which detract from the value and desirability of the semiconductor device group. Segregation layers 301 prevent this boron segregation which, in turn, helps to maintain the consistency of the threshold voltage. Therefore, not only is the current capacity maximized by having the wider active area location, but the threshold voltage remains consistent between the adjacent devices because segregation layer 301. Moreover, as noted above, because the tapering orients the top region of the active area to be larger than the bottom region of the active area, the reverse orientation holds for dielectric layers 301. The portions of dielectric layer 301 between the bottom regions of the active areas are larger, which increases the isolating effect between each device.

Figure 4:
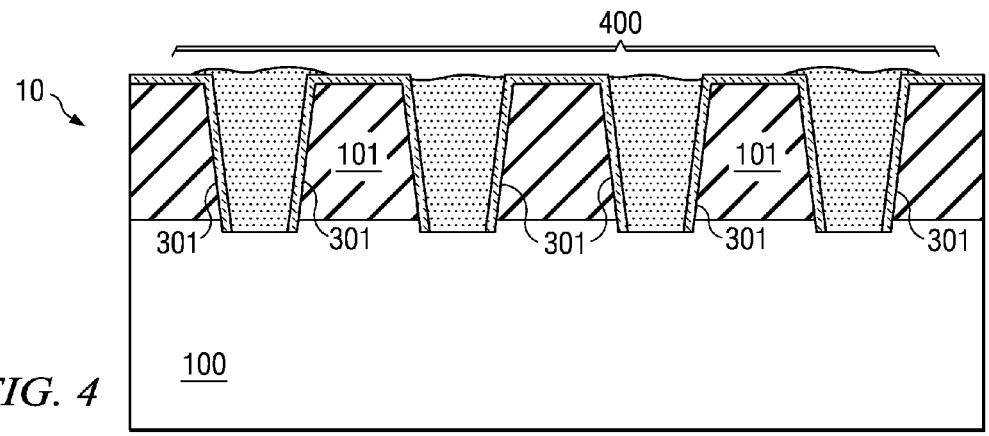
FIG. 4 is a diagram illustrating the semiconductor wafer in a next processing step configured according to one embodiment of the present invention.

FIG. 4 is a diagram illustrating semiconductor wafer 10 in a next processing step configured according to one embodiment of the present invention. Once barrier material 300 (FIG. 3) has been implanted to form segregation layers 301, semiconductor wafer 10 is again cleaned to remove any surface impurities. After cleaning, epi-silicon is grown in each of tapered trenches 200 (FIG. 2) to form active regions 400.

Figure 5:
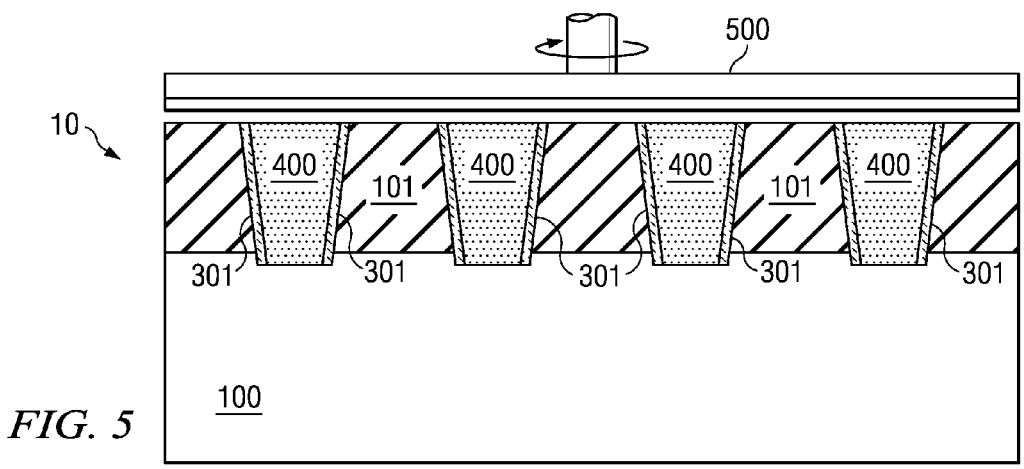
FIG. 5 is a diagram illustrating the semiconductor wafer in a next processing step configured according to one embodiment of the present invention.

FIG. 5 is a diagram illustrating semiconductor wafer 10 in a next processing step configured according to one embodiment of the present invention. After silicon islands 400 are grown in FIG. 4, they may have a silicon overfill or underfill. In the process depicted in FIG. 5, chemical mechanical polish (CMP) device 500 performs CMP on semiconductor device 10 to either remove the silicon overfill or etch down the top surface of dielectric layer 101 to make a planar surface.

Once this process is complete, additional processing is performed to create various semiconductor devices in each of active regions 400. Because active regions 400 are formed in dielectric layer 101 and segregation layer 301 is formed as a layer within dielectric instead of layered on top of the surface of dielectric layer 101, the dimensions of the semiconductor devices in active regions 400 remain true to the design specifications. Thus, electrical isolation between devices is maintained while also maintaining the device dimensions. Using the process configured according to the present invention, therefore, generates devices that operate according to the exact design dimensions, without any geometric loss of device area caused by oxidation of STI dielectrics, and still maintains sufficient isolations from other devices sharing the same die or chip.

It should be noted that other finishing/etching processes may be used to create a planar surface on the finished semiconductor wafer. The various embodiments of the present invention are not limited to the use of CMP processes.

Figure 6:
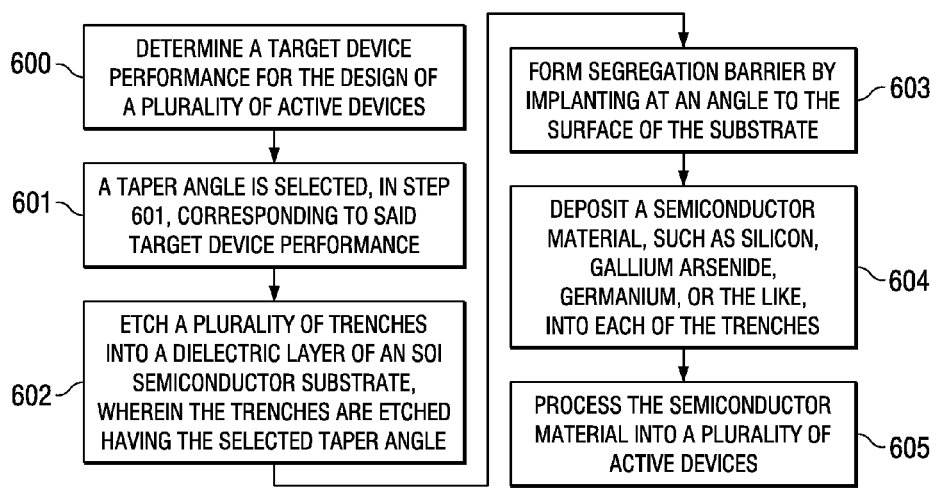
FIG. 6 is a flowchart illustrating example steps executed to implement one embodiment of the present invention.

FIG. 6 is a flowchart illustrating example steps executed to implement one embodiment of the present invention. In step 600, a target device performance is determined for the design of a plurality of active devices. A taper angle is selected, in step 601, corresponding to said target device performance. In step 602, a plurality of trenches is etched into a dielectric layer of a SOI semiconductor substrate, wherein the trenches are etched having the selected taper angle. In step 603, a segregation barrier is implanted at an angle to the surface of the SOI wafer surface. A semiconductor material is deposited, in step 604, into each of the trenches. The semiconductor material is then processed into a plurality of active devices in step 605.

It should be noted that the various embodiments of the present invention may grow epi-silicon for the semiconductor material or any other semiconductor material, such as gallium arsenide, germanium, or the like. The various embodiments are not limited to only epi-silicon growth to form the active areas.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for isolating active devices, said method comprising:

etching a plurality of tapered trenches having sidewalls and a bottom surface into a dielectric layer, said dielectric layer lying over a semiconductor substrate and having a top surface;

implanting carbon and/or nitrogen into the dielectric layer to form a segregation barrier beneath a surface of the sidewalls of said plurality of tapered trenches and beneath the top surface of said dielectric layer;

filling each of said plurality of tapered trenches with a semiconductor material, wherein the segregation barrier forms a barrier layer comprising carbon and/or nitrogen for preventing the transport of boron from said semiconductor material into said dielectric layer; and processing said semiconductor material into a plurality of the isolated active devices.

2. The method of claim 1 wherein said filling comprises:

growing epitaxial silicon in each of said plurality of tapered trenches.

3. The method of claim 1 wherein said semiconductor material comprises one of:
  silicon;
  gallium arsenide; and
  germanium.

4. The method of claim 1 wherein said segregation barrier layer is composed of carbon and nitrogen.

5. The method of claim 1 further comprising:
  cleaning exposed surfaces after said etching and prior to said filling growing.

6. The method of claim 1 further comprising:
  depositing a dielectric material onto said semiconductor substrate to form said dielectric layer.

7. The method of claim 1 wherein said dielectric layer is an insulator part of a silicon-on-insulator (SOT) wafer.

8. The method of claim 1 wherein said etching comprises:
  determining a taper angle of said plurality of tapered trenches according to a selected maximum device performance; and
  etching said dielectric layer according to said determined taper angle.

9. The method of claim 1 wherein said dielectric layer comprises one of:
  silicon dioxide; and
  silicon nitride.

10. The method of claim 1 wherein said dielectric layer comprises one of
  a high-k dielectric; and
  a low-k dielectric.

11. A method for manufacturing a plurality of isolated devices on a semiconductor wafer, said method comprising:
  creating a plurality of tapered cavities in a dielectric layer lying on a semiconductor substrate, the tapered cavities comprising sidewalls and a bottom surface, the bottom surface exposing portions of the semiconductor substrate;
  implanting carbon and/or nitrogen into surfaces of said plurality of tapered cavities to form a segregation barrier beneath said surfaces, the segregation barrier being formed also on a top surface of the dielectric layer;
  depositing a semiconductor material into said plurality of tapered cavities, the semiconductor material physically contacting the exposed portions of the semiconductor substrate, wherein the segregation barrier forms a barrier layer comprising carbon and/or nitrogen for preventing the transport of boron from said semiconductor material into said dielectric layer; and
  processing said deposited semiconductor material in said plurality of tapered cavities into the plurality of isolated active devices.

12. The method of claim 11 further comprising:
  removing debris from said semiconductor wafer after said creating and before said depositing.

13. The method of claim 11 further comprising:
  depositing a dielectric material onto said semiconductor substrate to form said dielectric layer.

14. The method of claim 13 wherein said dielectric material is one of:
  a high-k dielectric; and
  a low-k dielectric.

15. The method of claim 11 wherein said dielectric layer is an insulator layer of a silicon-on-insulator (SOI) wafer.

16. The method of claim 11 further comprising:
  determining a target device performance for said plurality of active devices, wherein said creating includes:
    selecting a taper angle for each of said plurality of tapered cavities, said taper angle corresponding to said determined target performance; and
    etching said plurality of tapered cavities according to said taper angle.

17. A method for forming a semiconductor device, said method comprising:
  forming a trench in a dielectric layer disposed above a semiconductor substrate, the trench having sidewalls extending from a top edge of the trench to a bottom surface of the trench exposing a portion of the semiconductor substrate, wherein a cross sectional dimension of the trench at the top edge is larger than the cross sectional dimension of the trench adjacent the bottom surface;
  implanting carbon and/or nitrogen into the dielectric layer to form a segregation barrier beneath a surface of the sidewalls of said trench, the segregation barrier being formed also on a top surface of the dielectric layer;
  filling the trench with a semiconductor material, the semiconductor material contacting the exposed portion of the semiconductor substrate, wherein the segregation bather forms a barrier layer comprising carbon and/or nitrogen for the transport of boron from said semiconductor material into said dielectric layer; and
  forming an active device comprising the semiconductor material.

18. The method of claim 17, wherein filling the trench comprises epitaxially growing silicon from the exposed portion of the semiconductor substrate.

19. The method of claim 17, wherein the implanting is performed at an angle from a normal to the top surface of said dielectric layer.

* * * * *

UNITED STATES PATENT AND TRADEMARK OFFICE
CERTIFICATE OF CORRECTION

PATENT NO. : 7,892,939 B2  
APPLICATION NO. : 12/043384  
DATED : February 22, 2011  
INVENTOR(S) : Hampp et al.

Page 1 of 1

It is certified that error appears in the above-identified patent and that said Letters Patent is hereby corrected as shown below:

In Col. 5, line 15, claim 7, delete "(SOT)" and insert --(SOI)--.
In Col. 6, line 37, claim 17, delete "bather" and insert --barrier--.
In Col. 6, line 39, claim 17, before "the transport" insert --preventing--.

Signed and Sealed this
Seventh Day of June, 2011

David J. Kappos
*Director of the United States Patent and Trademark Office*